(12) United States Patent
Shigematsu et al.

(10) Patent No.: US 12,107,010 B2
(45) Date of Patent: Oct. 1, 2024

(54) MANUFACTURING METHOD OF DEVICE CHIP

(71) Applicant: DISCO CORPORATION, Tokyo (JP)

(72) Inventors: Koichi Shigematsu, Tokyo (JP); Kei Tanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 514 days.

(21) Appl. No.: 17/446,744

(22) Filed: Sep. 2, 2021

(65) Prior Publication Data

US 2022/0102214 A1 Mar. 31, 2022

(30) Foreign Application Priority Data

Sep. 25, 2020 (JP) .................................. 2020-161305

(51) Int. Cl.
*H01L 21/78* (2006.01)
(52) U.S. Cl.
CPC .................................... *H01L 21/78* (2013.01)
(58) Field of Classification Search
CPC ....................................................... H01L 21/78
See application file for complete search history.

(56) References Cited

U.S. PATENT DOCUMENTS

| 2004/0266138 A1* | 12/2004 | Kajiyama | ............... H01L 24/27 257/E21.599 |
| 2005/0059325 A1* | 3/2005 | Nagai | ................... B24B 37/042 451/41 |
| 2015/0243560 A1* | 8/2015 | Yodo | .................. H01L 21/6836 438/462 |

FOREIGN PATENT DOCUMENTS

| JP | 07149393 A | 6/1995 |
| JP | 2002192370 A | 7/2002 |
| JP | 2014146810 A | 8/2014 |
| JP | 2019156405 A | 9/2019 |

* cited by examiner

*Primary Examiner* — Monica D Harrison
*Assistant Examiner* — Andre C Stevenson
(74) *Attorney, Agent, or Firm* — Greer, Burns & Crain, Ltd.

(57) ABSTRACT

A manufacturing method of a device chip includes removing a film in regions corresponding to streets, forming a modified layer inside a wafer by irradiating a laser beam from the back surface side of the wafer along regions corresponding to the regions from which the film has been removed, and giving an external force to the wafer to divide the wafer into individual device chips. In film removal, the distance from an end part of the street in the width direction to the region from which the film is to be removed is set equal to or shorter than a predetermined upper limit value to cause formation of a step between a region in which a substrate is exposed and a region coated with the film at an outer edge part of the device chip when the wafer is divided into the individual device chips in the dividing step.

18 Claims, 8 Drawing Sheets

MANUFACTURING METHOD OF DEVICE CHIP

BACKGROUND OF THE INVENTION

Field of the Invention

The present invention relates to a manufacturing method of a device chip.

Description of the Related Art

Semiconductor device chips are manufactured by dividing a wafer having streets (planned dividing lines) set on a front surface and devices marked out by the streets along the streets to dice the wafer into individual pieces for each device. As a method for dividing a plate-shaped workpiece such as a semiconductor wafer, a method is known in which the origin of dividing (modified layer) is formed by executing irradiation with a pulse laser beam with a wavelength having transmissibility with respect to the workpiece along streets with the focal point adjusted to the inside of the region to be divided (refer to Japanese Patent No. 3408805).

SUMMARY OF THE INVENTION

Incidentally, in recent years, the following semiconductor wafers have been put into practical use: a semiconductor wafer in which a low dielectric constant insulator coat (Low-k film) formed of an inorganic film of SiOF, BSG (SiOB), or the like or an organic film that is a polymer film of a polyimide-based material, parylene-based material, or the like and a functional film to form devices are stacked over a surface of a substrate of silicon (Si) or the like in order to improve the processing capability of semiconductor chips of an integrated circuit (IC), large scale integration (LSI), or the like; and a semiconductor wafer configured in such a manner that a metal pattern that is referred to as a test element group (TEG) and is obtained by stacking an electrical conductor film formed of a metal or the like is partly disposed on streets to test functions of devices through the metal pattern before the wafer is divided.

The wafer in which the Low-k film is stacked over a surface of a substrate and the wafer in which the TEG is disposed on streets like the above-described ones involve a problem that, even when a method in which an external force is given after a modified layer that becomes the origin of dividing is formed inside the substrate is used, it is impossible to surely split the Low-k film or the TEG and the functional layer is separated to lower the quality of the individual device chips.

Regarding this problem, a method has been proposed in which irradiation with a laser beam with a wavelength having absorbability with respect to a functional layer stacked over a substrate is executed before a modified layer is formed by a laser beam with a wavelength having transmissibility with respect to the substrate (refer to Japanese Patent Laid-open No. 2014-146810).

Device chips manufactured in this manner are shipped and conveyed in such a manner as to be housed in a carrier tape with a pocket shape described in Japanese Patent Laid-open No. Hei 7-149393 and Japanese Patent Laid-open No. 2019-156405. However, this causes a new problem that, due to application of vibrations and so forth in transportation, the semiconductor device chip moves inside the pocket and collides with a pocket sidewall and the functional layer is separated.

Thus, an object of the present invention is to provide a manufacturing method of a device chip that can suppress separation of a functional layer when shock is applied.

In accordance with an aspect of the present invention, there is provided a manufacturing method of a device chip by which a wafer in which a device is formed in each of a plurality of regions marked out by a plurality of streets formed in a lattice manner in a front surface of a substrate and front surfaces of the streets are coated with a film is divided into individual device chips along the streets. The manufacturing method includes a film removal step of removing the film in regions corresponding to the streets, a modified layer forming step of, after executing the film removal step, forming a modified layer inside the wafer through positioning a focal point of a laser beam with a wavelength having transmissibility with respect to the wafer inside the wafer and executing irradiation with the laser beam from a back surface side of the wafer along regions corresponding to the regions from which the film has been removed, and a dividing step of giving an external force to the wafer and dividing the wafer into the individual device chips after executing the modified layer forming step. In the film removal step, a distance from an end part of the street in a width direction to the region from which the film is to be removed is set equal to or shorter than a predetermined upper limit value to cause formation of a step between a region in which the substrate is exposed and a region coated with the film at an outer edge part of the device chip when the wafer is divided into the individual device chips in the dividing step.

Preferably, in the film removal step, the film is removed by positioning a focal point of a laser beam with a wavelength having absorbability with respect to the film onto the film and executing irradiation with the laser beam along the streets to execute ablation processing.

Preferably, the manufacturing method of a device chip further includes a wafer support step of sticking a tape to the back surface side of the wafer and supporting an outer circumferential part of the tape by an annular frame before the film removal step and, in the modified layer forming step, the modified layer is formed inside the wafer through the tape by executing irradiation with a laser beam with a wavelength having transmissibility with respect to the wafer and the tape along the streets from a side of the tape of the wafer for which the wafer support step has been executed in such a manner that the focal point is positioned inside the wafer.

According to the invention of the present application, separation of the functional layer when shock is applied can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Further, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

Figure 1:
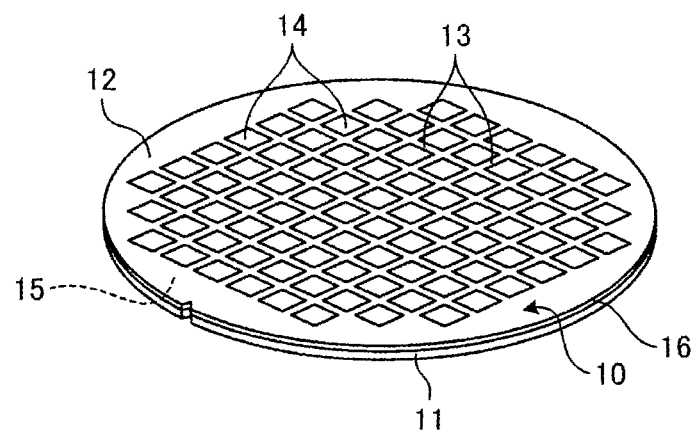
FIG. 1 is a perspective view illustrating one example of a wafer of a processing target of a manufacturing method of a device chip according to an embodiment.
Figure 2:
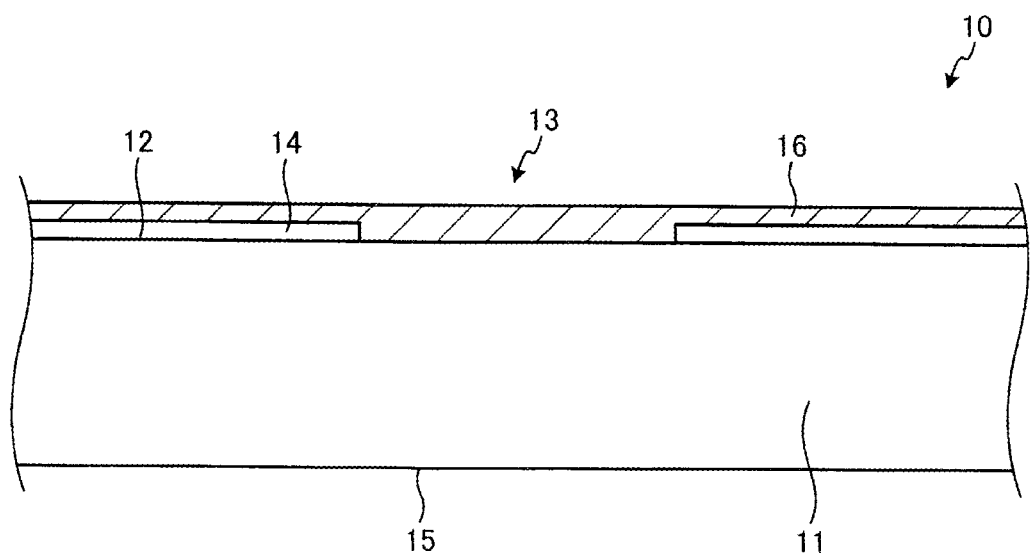
FIG. 2 is an enlarged sectional view of the major part of the wafer illustrated in FIG. 1.

A manufacturing method of a device chip according to the embodiment of the present invention will be described based on drawings. First, the configuration of a wafer 10 that is a processing target in the embodiment will be described. FIG. 1 is a perspective view illustrating one example of the wafer 10 that is the processing target of the manufacturing method of a device chip according to the embodiment. FIG. 2 is a sectional view of the major part of the wafer 10 illustrated in FIG. 1.

As illustrated in FIG. 1, the wafer 10 is a circular-disc-shaped wafer such as a semiconductor wafer or optical device wafer including silicon, sapphire ($Al_2O_3$), gallium arsenide (GaAs), or silicon carbide (SiC) as a substrate 11. The wafer 10 has plural streets 13 (planned dividing lines) set in a lattice manner in a front surface 12 of the substrate 11 and devices 14 formed in regions marked out by the streets 13.

For example, the devices 14 are integrated circuits such as an IC or LSI or image sensors of a charge coupled device (CCD), complementary metal oxide semiconductor (CMOS), or the like. The surface of the wafer 10 located on the side opposite to the front surface 12 on which the devices 14 are formed is defined as a back surface 15.

Furthermore, in the wafer 10, the front surface 12 of the substrate 11 is coated with a film 16. The film 16 is a functional layer in which low dielectric constant insulator coats (hereinafter, referred to as a Low-k film) formed of an inorganic film of SiOF, BSG (SiOB), or the like or an organic film that is a polymer film of a polyimide-based material, parylene-based material, or the like and an electrical conductor film composed of an electrically-conductive metal are stacked. The Low-k films are stacked with the electrical conductor film to form the devices 14. The electrical conductor film configures circuits of the devices 14. Thus, the devices 14 are configured by the Low-k films stacked over each other and the electrical conductor film stacked between the Low-k films.

Figure 11:
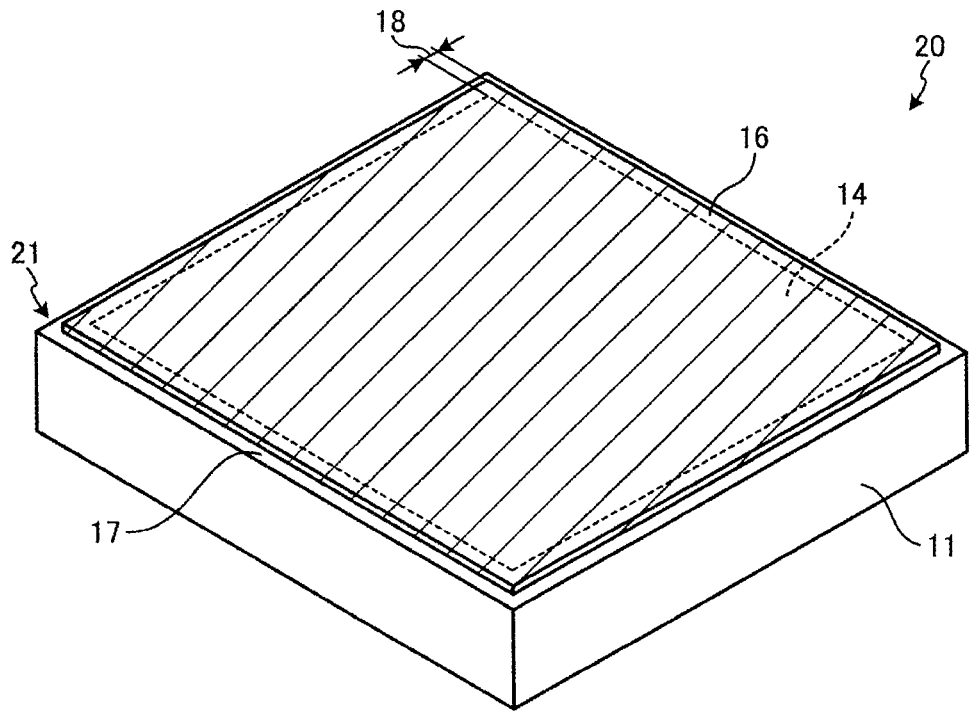
FIG. 11 is a perspective view illustrating one example of a device chip manufactured by the manufacturing method of a device chip according to the embodiment.

The wafer 10 is divided into the individual devices 14 along the streets 13 to be manufactured into device chips 20 (see FIG. 11). Although having a square shape in the embodiment, the device chips 20 may have a rectangular shape.

Figure 3:
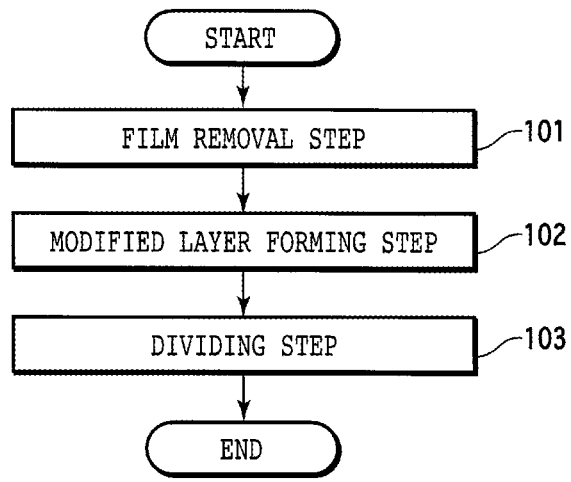
FIG. 3 is a flowchart illustrating the flow of the manufacturing method of a device chip according to the embodiment.

Next, the manufacturing method of a device chip according to the embodiment will be described. FIG. 3 is a flowchart illustrating the flow of the manufacturing method of a device chip according to the embodiment. The manufacturing method of a device chip according to the embodiment includes a film removal step 101, a modified layer forming step 102, and a dividing step 103 as illustrated in FIG. 3.

(Film Removal Step 101)

Figure 4:
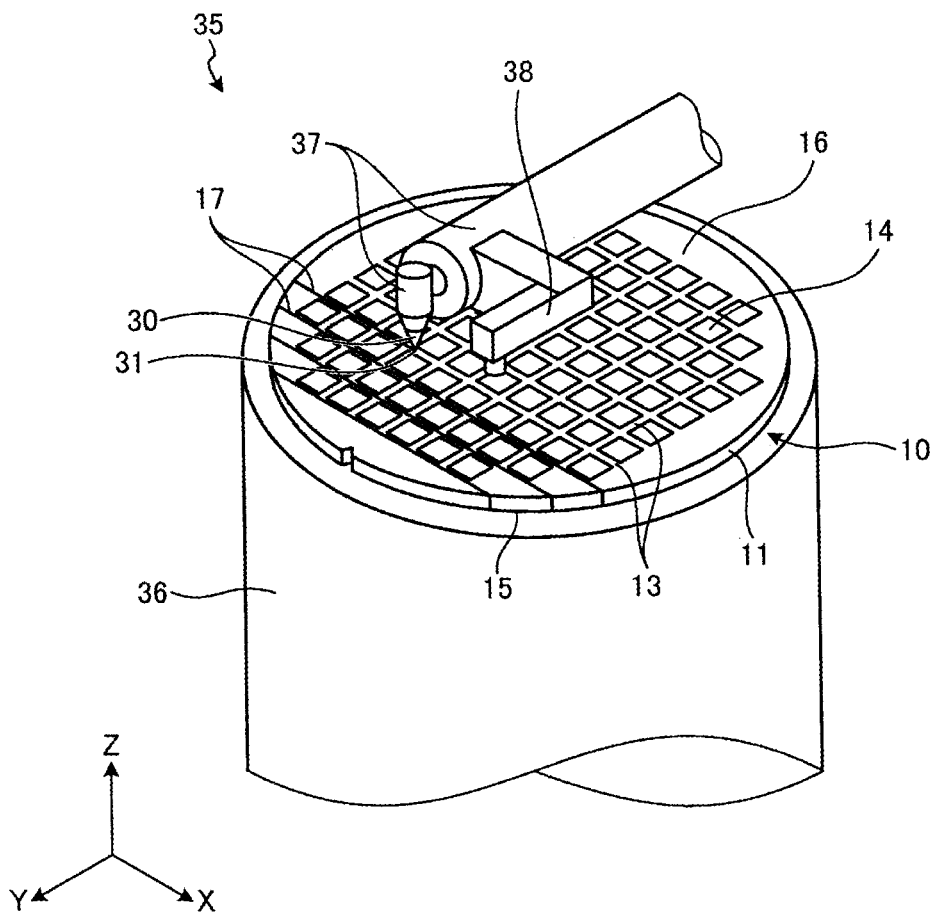
FIG. 4 is a perspective view illustrating one example of a film removal step illustrated in FIG. 3.
Figure 5:
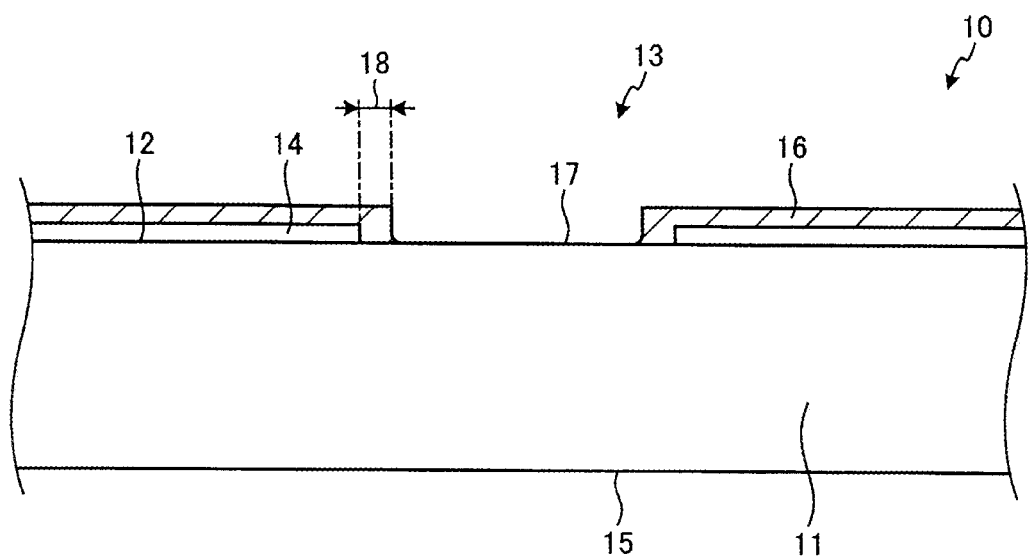
FIG. 5 is an enlarged sectional view of the major part of the wafer illustrating one state obtained after the film removal step illustrated in FIG. 3.
Figure 6:
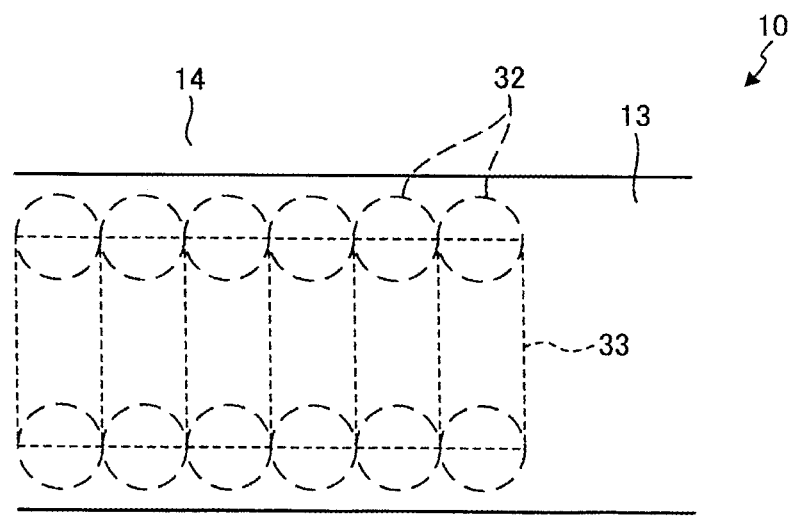
FIG. 6 is an explanatory diagram schematically illustrating a processing line by a laser beam in the film removal step illustrated in FIG. 3.

FIG. 4 is a perspective view illustrating one example of the film removal step 101 illustrated in FIG. 3. FIG. 5 is a sectional view of the major part of the wafer 10 illustrating one state obtained after the film removal step 101 illustrated in FIG. 3. FIG. 6 is an explanatory diagram schematically illustrating a processing line by a laser beam 30 in the film removal step 101 illustrated in FIG. 3. The film removal step 101 is a step of exposing the side of the film 16 of the wafer 10 and removing the film 16 in regions corresponding to the streets 13.

As illustrated in FIG. 4, in the film removal step 101 in the embodiment, the film 16 is removed by executing ablation processing by the laser beam 30. The laser beam 30 is a laser beam with a wavelength having absorbability with respect to the film 16. A laser processing apparatus 35 that executes laser processing by the laser beam 30 includes a chuck table 36, a laser beam irradiation unit 37, an imaging unit 38, and a movement unit that relatively moves the chuck table 36 and the laser beam irradiation unit 37.

In the film removal step 101, first, the side of the back surface 15 of the wafer 10 is held under suction on the chuck table 36. Next, the chuck table 36 is moved to a processing position by the movement unit. Next, the street 13 is detected by imaging the wafer 10 by the imaging unit 38. After the street 13 is detected, alignment to execute position adjustment between the street 13 of the wafer 10 and an irradiation part of the laser beam irradiation unit 37 is carried out.

In the film removal step 101, while the chuck table 36 is moved relative to the laser beam irradiation unit 37, irradiation with the pulsed laser beam 30 is executed from the side coated with the film 16 in the wafer 10 with a focal point 31 positioned on the film 16 of the wafer 10. The laser beam 30 is a laser beam with a wavelength having absorbability with respect to the film 16. In the film removal step 101, the film 16 in regions corresponding to the streets 13 is removed by executing irradiation with the laser beam 30 having the focal point 31 positioned on the film 16 of the wafer 10 along the streets 13.

At this time, as illustrated in FIG. 5, in the film removal step 101, a distance 18 from the end part of the street 13 in the width direction to the region from which the film 16 is to be removed (film removal region 17) is set equal to or shorter than a predetermined upper limit value. In the embodiment, the width of the street 13 is 80 μm and the predetermined upper limit value is, for example, 30 μm. Due to such setting, in the street 13, a step is formed between the film removal region 17 in which the substrate 11 is exposed through the removal of the film 16 and the region coated with the film 16.

The predetermined upper limit value of the distance 18 is set in a range in which the width of the film removal region 17 (distance between the steps of each street 13) satisfies a predetermined condition. In a case in which the film removal region 17 is made with a wide width, even when the position at which a modified layer 19 is formed slightly deviates in the width direction of the street 13 in the modified layer forming step 102 to be described later, failure in dividing can be suppressed when the wafer 10 is divided with use of the modified layer 19 as the origin of breaking. That is, the predetermined condition includes the condition that failure in dividing due to an error can be suppressed even in consideration of an error in the formation position of the modified layer 19 due to limitation on the refractive index of the substrate 11 and so forth with respect to the laser beam 30, the optical system of the laser beam irradiation unit 37 that executes irradiation with the laser beam 30, and so forth. It is preferable that the distance 18 be set equal to or shorter than the distance between the device 14 and the edge of the film removal region 17 with the minimum width that allows suppression of failure in dividing due to an error in the position at which the modified layer 19 is formed through focusing of the laser beam 30 on a desired position inside the substrate 11.

Furthermore, in the film removal step 101, the distance 18 is set equal to or longer than a predetermined lower limit value. The predetermined lower limit value is a value smaller than the predetermined upper limit value and is at least larger than the sum of the width of a heat-affected region caused by the laser beam 30 and the error in the formation position of the modified layer 19 formed in the modified layer forming step 102 to be described later in the width direction of the street 13. The heat-affected region is a region in which the film 16 is affected by heat of the laser beam 30 and alters at the edge of a groove formed when ablation processing is executed through irradiation of the film 16 with the laser beam 30. By setting the distance 18 in consideration of the width of the heat-affected region and the error in the formation position of the modified layer 19, the occurrence of the situation in which the devices 14 suffer from the heat influence of the laser beam 30 that removes the film 16 and the heat influence of the laser beam 30 that forms the modified layer 19 can be suppressed. In the embodiment, it is preferable that the distance 18 be set equal to or longer than, for example, 10 μm. Moreover, by setting the distance 18 as short as possible while the width of the heat-affected region and the error in the formation position of the modified layer 19 are considered, the film 16 can be removed with the maximum removal width and the film removal region 17 can be allowed to be as close to the device 14 as possible without suffering from the heat influence of the laser beam 30.

In the film removal step 101, as illustrated in FIG. 6, a narrow beam that forms a circular spot 32 and a wide beam that forms a spot 33 with an elliptical shape or rectangular shape are used. More specifically, in the region irradiated with the laser beam 30, both end parts of the street 13 in the width direction are irradiated with the narrow beam with one pass. Furthermore, the region between the circular spots 32 irradiated with the narrow beam is irradiated with the wide beam with two passes.

Laser processing conditions in the film removal step 101 are set as follows, for example, when the thickness of the wafer 10 is 200 μm.
 Wavelength: 355 nm
 Output power: 2 W
 Frequency: 200 kHz
 Feed rate: 500 mm/s
 Wide beam width: 25 μm (Modified Layer Forming Step 102)

Figure 7:
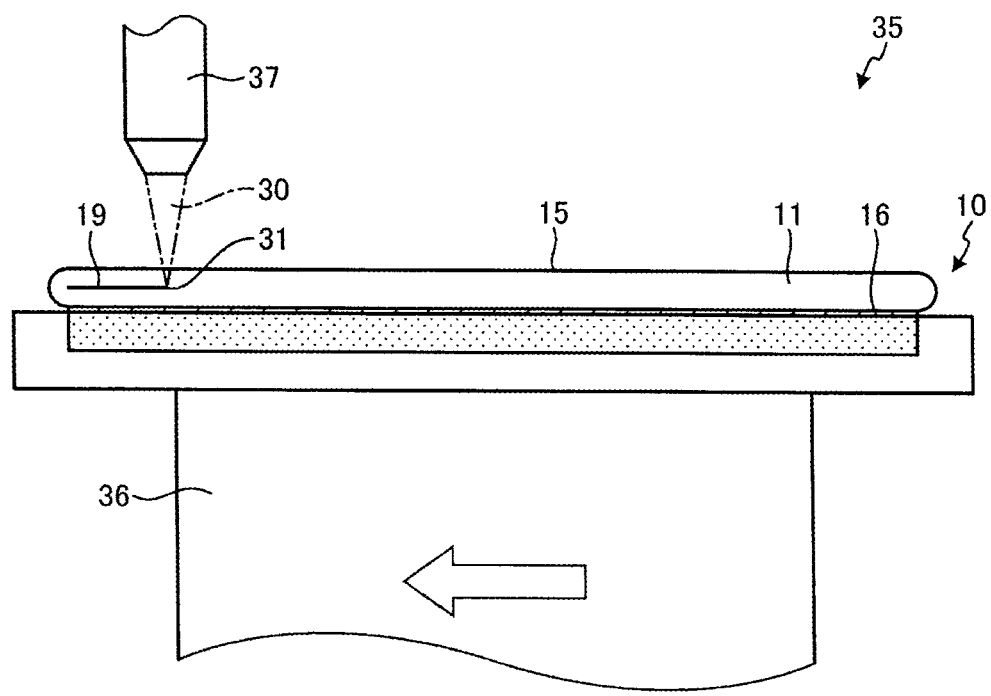
FIG. 7 is a partial sectional side view illustrating one state of a modified layer forming step illustrated in FIG. 3.
Figure 8:
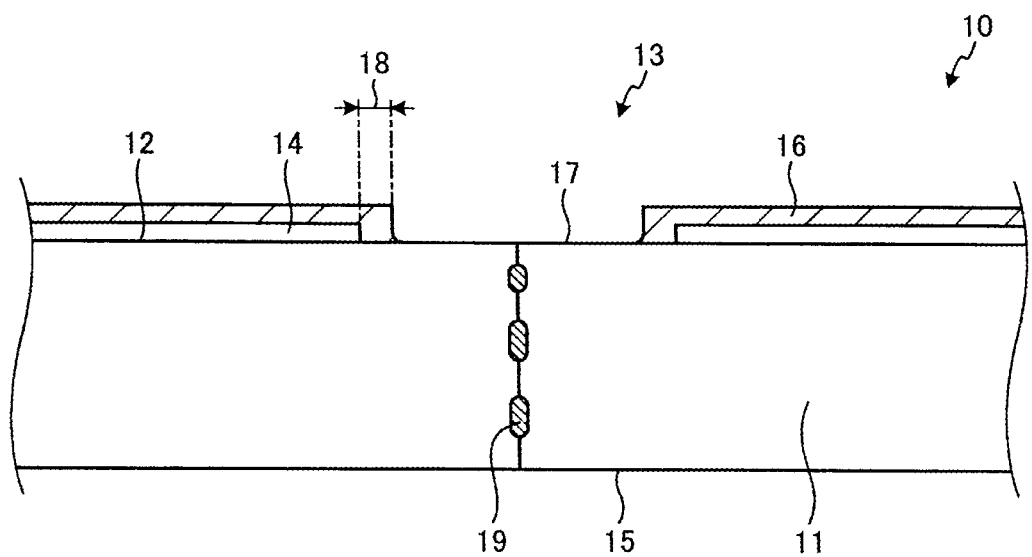
FIG. 8 is a sectional view of the major part of the wafer illustrating one state obtained after the modified layer forming step illustrated in FIG. 3.

FIG. 7 is a partial sectional side view illustrating one state of the modified layer forming step 102 illustrated in FIG. 3. FIG. 8 is a sectional view of the major part of the wafer 10 illustrating one state obtained after the modified layer forming step 102 illustrated in FIG. 3. The modified layer forming step 102 is executed after the film removal step 101 is executed. The modified layer forming step 102 is a step of forming the modified layer 19 inside the wafer 10 along regions corresponding to the regions from which the film 16 has been removed in the wafer 10.

The modified layer 19 means a region in which the density, the refractive index, the mechanical strength, or any other physical characteristic has become a different state from that of the surroundings. Examples of the modified layer 19 include a melting treatment region, a crack region, an electrical breakdown region, a refractive index change region, a region in which these regions exist in a mixed manner, and so forth. In the modified layer 19, the mechanical strength and so forth are lower than the other part in the wafer 10.

As illustrated in FIG. 7, in the modified layer forming step 102 in the embodiment, the modified layer 19 is formed by executing stealth dicing processing by the laser beam 30. The laser beam 30 is a laser beam with a wavelength having transmissibility with respect to the wafer 10.

In the modified layer forming step 102, first, the side coated with the film 16 in the wafer 10 is held under suction on the chuck table 36. Next, the chuck table 36 is moved to a processing position by the movement unit. Next, the street 13 is detected by imaging the wafer 10 by the imaging unit 38. After the street 13 is detected, alignment to execute position adjustment between the street 13 of the wafer 10 and the irradiation part of the laser beam irradiation unit 37 is carried out.

In the modified layer forming step 102, while the chuck table 36 is moved relative to the laser beam irradiation unit 37, irradiation with the pulsed laser beam 30 is executed from the side of the back surface 15 of the wafer 10 with the focal point 31 positioned inside the wafer 10. The laser beam 30 is a laser beam with a wavelength having transmissibility with respect to the wafer 10. In the modified layer forming step 102, the modified layer 19 along the streets 13 is formed inside the substrate 11 as illustrated in FIG. 8 by executing irradiation with the laser beam 30 having the focal point 31 positioned inside the wafer 10 along the regions corresponding to the regions from which the film 16 has been removed.

Laser processing conditions in the modified layer forming step 102 are set as follows, for example.
 Wavelength: 1064 nm
 Output power: 0.5 W
 Frequency: 100 kHz
 Feed rate: 200 mm/s (Dividing Step 103)

Figure 9:
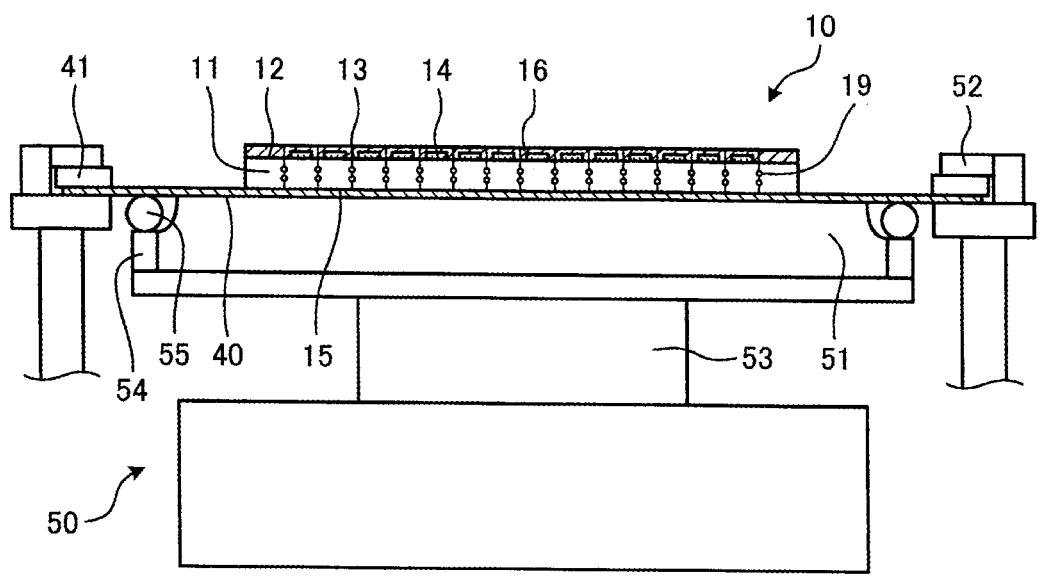
FIG. 9 is a partial sectional side view illustrating one state of a dividing step illustrated in FIG. 3.
Figure 10:
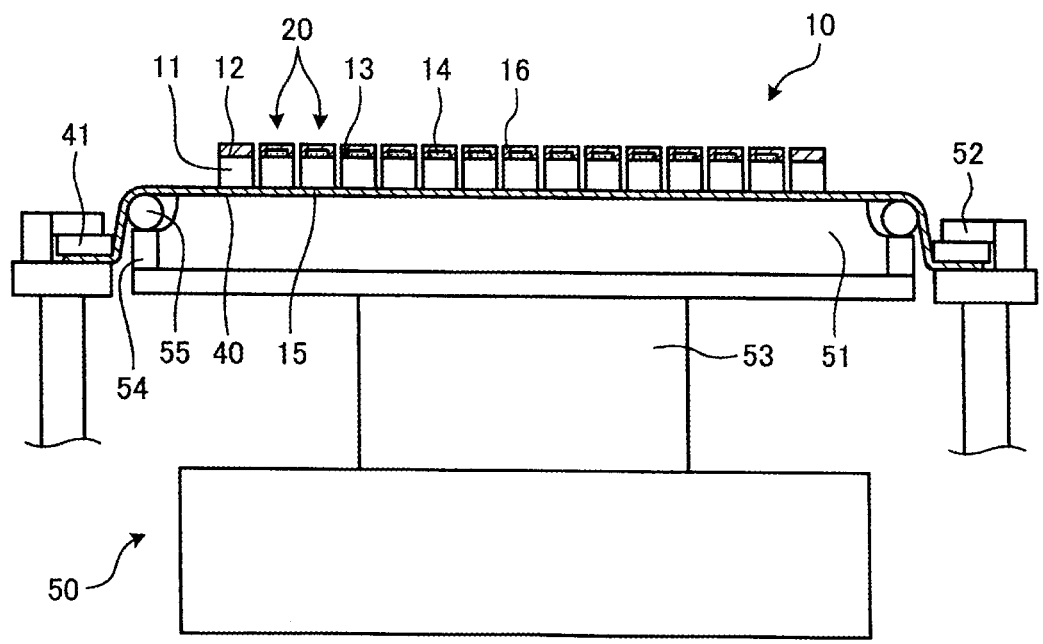
FIG. 10 is a partial sectional side view illustrating one state of the dividing step illustrated in FIG. 3 obtained after that illustrated in FIG. 9.

FIG. 9 is a partial sectional side view illustrating one state of the dividing step 103 illustrated in FIG. 3. FIG. 10 is a partial sectional side view illustrating one state of the dividing step 103 illustrated in FIG. 3 after FIG. 9. The dividing step 103 is executed after the modified layer forming step 102 is executed. The dividing step 103 is a step of giving an external force to the wafer 10 and dividing the wafer 10 into the individual device chips 20.

As illustrated in FIG. 9, in the dividing step 103 in the embodiment, the wafer 10 is diced into the individual device chips 20 with use of the modified layer 19 as the origin of breaking by expanding an expanding sheet 40 stuck to the side of the back surface 15 of the wafer 10 in the surface direction and the radial direction. In the dividing step 103, the expanding sheet 40 is stuck to the back surface 15 of the wafer 10 in advance.

For example, the expanding sheet 40 includes a base layer composed of a synthetic resin having expandability and a glue layer that is stacked on the base layer and is composed of a synthetic resin having expandability and adhesiveness. The expanding sheet 40 is stuck to the back surface side of an annular frame 41. The frame 41 has an opening larger than the outer diameter of the wafer 10 and is composed of a material such as a metal or a resin. The wafer 10 is positioned to a predetermined position in the opening of the frame 41, and the back surface 15 of the wafer 10 is stuck to the front surface of the expanding sheet 40. As a result, the wafer 10 is fixed to the expanding sheet 40 and the frame 41.

As illustrated in FIG. 9 and FIG. 10, in the dividing step 103 in the embodiment, an external force in the surface direction and the radial direction is given to the expanding sheet 40 by an expanding apparatus 50. The expanding apparatus 50 includes a chuck table 51, clamp parts 52, a raising-lowering unit 53, a push-up component 54, and roller components 55. The push-up component 54 is a component that has a circular cylindrical shape and is disposed at the outer circumference of the chuck table 51 and in a coaxial relation with the chuck table 51. The roller components 55 are rotatably disposed on the same plane as the holding surface of the chuck table 51 or slightly over the holding surface and on the upper end of the push-up component 54.

As illustrated in FIG. 9, in the dividing step 103, first, the side of the back surface 15 of the wafer 10 is placed over the holding surface of the chuck table 51 with the interposition of the expanding sheet 40, and the outer circumferential part of the frame 41 is fixed by the clamp parts 52. At this time, the roller components 55 abut against the expanding sheet 40 between the inner edge of the frame 41 and the outer edge of the wafer 10.

As illustrated in FIG. 10, in the dividing step 103, next, the chuck table 51 and the push-up component 54 are integrally raised by the raising-lowering unit 53. At this time, in the expanding sheet 40, the part between the inner edge of the frame 41 and the outer edge of the wafer 10 is expanded in the surface direction because the outer circumferential part is fixed by the clamp parts 52 with the interposition of the frame 41. Moreover, the roller components 55 disposed on the upper end of the push-up component 54 alleviate friction with the expanding sheet 40.

In the dividing step 103, as the result of the expansion of the expanding sheet 40, a tensile force radially acts on the expanding sheet 40. When the radial tensile force acts on the expanding sheet 40, as illustrated in FIG. 10, the wafer 10 to which the expanding sheet 40 is stuck is divided for each of the individual devices 14 with the modified layer 19 along the streets 13 being the origin of breaking, and is diced into each device chip 20. After the wafer 10 is divided into the device chips 20, for example, the device chips 20 are picked up from the expanding sheet 40 by a well-known picker in a pick-up step.

FIG. 11 is a perspective view illustrating one example of the device chip 20 manufactured by the manufacturing method of a device chip according to the embodiment. In the film removal step 101, for the film removal region 17 obtained by removal of the film 16 in the street 13 (see FIG. 5 and so forth), the film 16 is removed in such a manner that the distance 18 from the end part of the street 13 in the width direction becomes equal to or shorter than the predetermined upper limit value.

Due to this, in the device chips 20 individually divided in the dividing step 103, a step between the film removal region 17 in which the substrate 11 is exposed and the region coated with the film 16 is formed at an outer edge part 21. That is, there is a margin in the distance between the end part of the region coated with the film 16 and the outer edge part 21 of the device chip 20, and therefore an effect of suppressing separation of the film 16 is provided.

Figure 12:
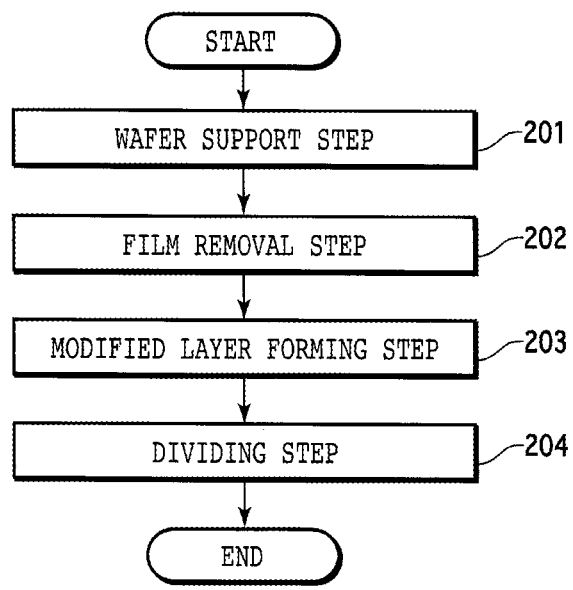
FIG. 12 is a flowchart illustrating the flow of a manufacturing method of a device chip according to a modification example.

Next, a manufacturing method of a device chip according to a modification example will be described. FIG. 12 is a flowchart illustrating the flow of the manufacturing method of a device chip according to the modification example. The manufacturing method of a device chip according to the modification example includes a wafer support step 201, a film removal step 202, a modified layer forming step 203, and a dividing step 204 as illustrated in FIG. 12.

(Wafer Support Step 201)

Figure 13:
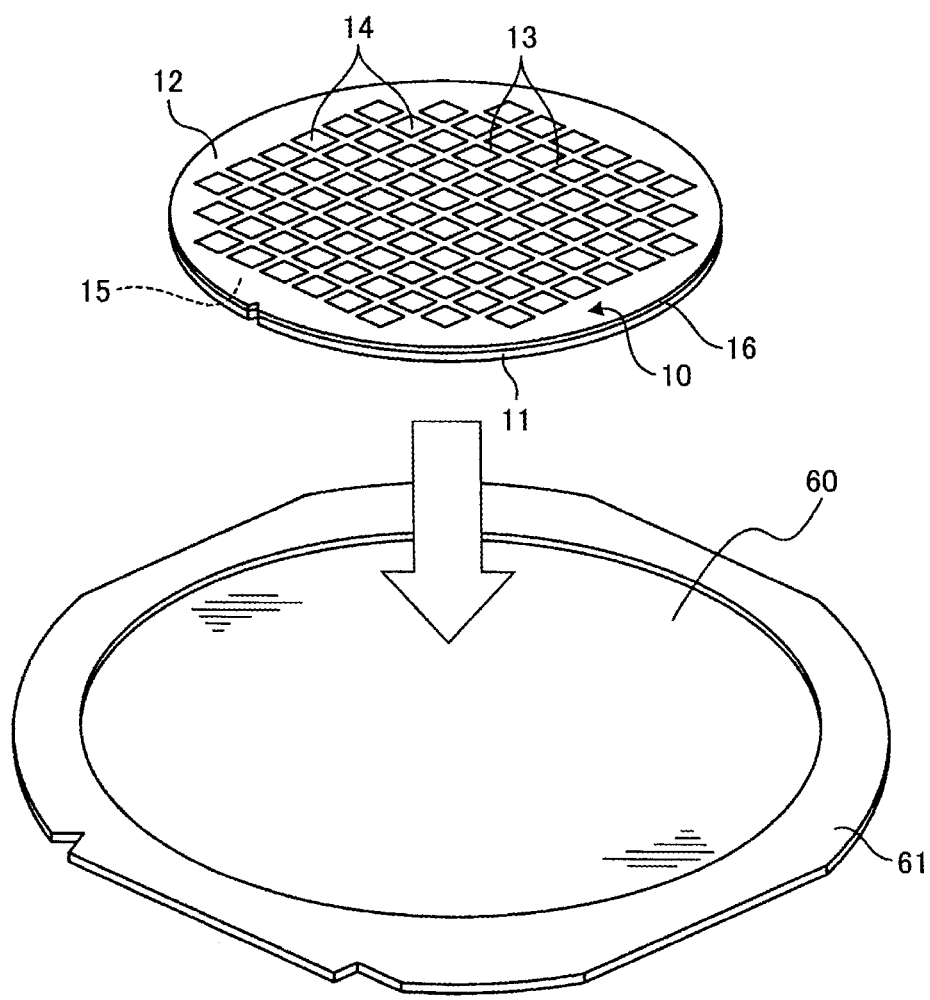
FIG. 13 is a perspective view illustrating one example of a wafer support step illustrated in FIG. 12.

FIG. 13 is a perspective view illustrating one example of the wafer support step 201 illustrated in FIG. 12. The wafer support step 201 is executed before the film removal step 202. The wafer support step 201 is a step of sticking a tape 60 to the side of the back surface 15 of the wafer 10 and supporting the outer circumferential part of the tape 60 by an annular frame 61.

The tape 60 is an adhesive tape for fixing the wafer 10 to the frame 61 in the film removal step 202 to be described later. For example, the tape 60 includes a base layer composed of a synthetic resin and a glue layer that is stacked on the base layer and is composed of a synthetic resin having adhesiveness. An expanding sheet having expandability may be used as the tape 60. In this case, the tape 60 may be used as the expanding sheet 40 in the dividing step 204 to be described later.

In the wafer support step 201, as illustrated in FIG. 13, first, the tape 60 is stuck to the back surface side of the annular frame 61. The frame 61 has an opening larger than the outer diameter of the wafer 10 and is composed of a material such as a metal or a resin. In the wafer support step 201, next, the wafer 10 is positioned to a predetermined position in the opening of the frame 61, and the side of the back surface 15 is stuck to the tape 60. Thereby, the wafer 10 is fixed to the tape 60 and the frame 61.

(Film Removal Step 202)

The basic procedure of the film removal step 202 in the modification example is similar to the film removal step 101 in the embodiment. The film removal step 202 in the modification example is different from the film removal step 101 in the embodiment in the following point. In the film removal step 202 in the modification example, when the wafer 10 is held by the chuck table 36 of the laser processing apparatus 35, the holding surface of the chuck table 36 is caused to suck and hold the side of the back surface 15 under suction with the interposition of the tape 60, and the outer circumferential part of the frame 61 is fixed by clamp parts 39 (see FIG. 14).

(Modified Layer Forming Step 203)

Figure 14:
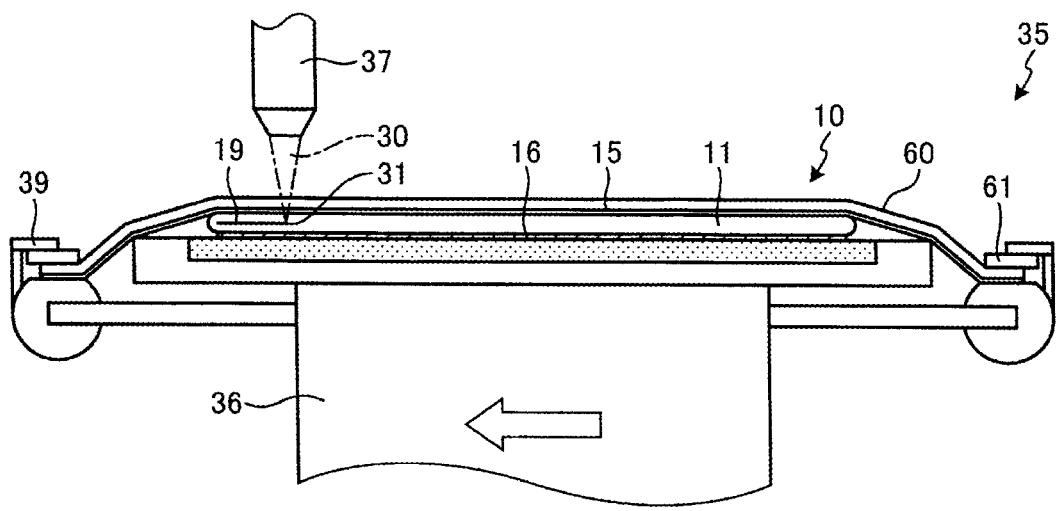
FIG. 14 is a partial sectional side view illustrating one state of a modified layer forming step illustrated in FIG. 12.

FIG. 14 is a partial sectional side view illustrating one state of the modified layer forming step 203 illustrated in FIG. 12. The modified layer forming step 203 is a step of forming the modified layer 19 inside the wafer 10 through the tape 60.

As illustrated in FIG. 14, in the modified layer forming step 203 in the modification example, the modified layer 19 is formed by executing stealth dicing processing by the laser beam 30 similarly to the modified layer forming step 102 in the embodiment. The laser beam 30 is a laser beam with a wavelength having transmissibility with respect to the wafer 10 and the tape 60.

In the modified layer forming step 203, first, the side coated with the film 16 in the wafer 10 is held under suction on the chuck table 36, and the outer circumferential part of the frame 61 is fixed by the clamp parts 39. Then, the chuck table 36 is moved to a processing position by the movement unit. Next, the street 13 is detected by imaging the wafer 10 by the imaging unit 38. After the street 13 is detected, alignment to execute position adjustment between the street 13 of the wafer 10 and the irradiation part of the laser beam irradiation unit 37 is carried out.

In the modified layer forming step 203, while the chuck table 36 is moved relative to the laser beam irradiation unit 37, irradiation with the pulsed laser beam 30 is executed from the side of the tape 60 of the wafer 10 with the focal point 31 positioned inside the wafer 10. The laser beam 30 is a laser beam with a wavelength having transmissibility with respect to the wafer 10 and the tape 60. In the modified layer forming step 203, the modified layer 19 along the streets 13 is formed inside the substrate 11 by executing irradiation with the laser beam 30 having the focal point 31 positioned inside the wafer 10 along regions corresponding to the regions from which the film 16 has been removed.

(Dividing Step 204)

The procedure of the dividing step 204 in the modification example is similar to that of the dividing step 103 in the embodiment, and therefore, description thereof is omitted. When the tape 60 stuck in the wafer support step 201 is one that has expandability, the tape 60 may be used as the expanding sheet 40 as it is.

As described above, in the manufacturing methods of a device chip according to the embodiment and the modification example, the width in the width direction of the street 13 regarding the film removal region 17 obtained by removal of the film 16 (functional layer) in the device chip 20 is set larger than the conventional width. That is, the distance between the end part of the region coated with the film 16 and the outer edge part 21 of the device chip 20 is set shorter than the conventional distance, and thus, a step between the film removal region 17 in which the substrate 11 is exposed and the region coated with the film 16 is formed at the outer edge part 21 of the device chip 20. Due to this, even if the device chip 20 vibrates in a carrier tape in conveyance of the manufactured device chips 20, collision of the functional layer with a sidewall can be avoided. Separation of the film 16 can be suppressed even when shock is applied, and contribution to reduction in defective quality can be obtained.

The present invention is not limited to the above-described embodiment. That is, the present invention can be carried out with various modifications without departing from the gist of the present invention. For example, in the film removal steps 101 and 202 in the embodiment and the modification example, the film 16 is removed by executing ablation processing by the laser beam 30. However, the film 16 may be removed by dicing processing by a blade.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of a device chip by which a wafer in which a device is formed in each of a plurality of regions marked out by a plurality of streets formed in a lattice manner in a front surface of a substrate and front surfaces of the streets are coated with a film is divided into individual device chips along the streets, the manufacturing method comprising:
   a film removal step of removing the film in regions corresponding to the streets;
   a modified layer forming step of, after executing the film removal step, forming a modified layer along the streets inside the wafer through positioning a focal point of a laser beam with a wavelength having transmissibility with respect to the wafer inside the wafer and executing irradiation with the laser beam from a back surface side of the wafer along regions corresponding to the regions from which the film has been removed; and
   a dividing step of giving an external force to the wafer and dividing the wafer along the streets into the individual device chips after executing the modified layer forming step with use of the modified layer as the origin of division of the wafer, wherein
   in the film removal step, a distance from an end part of the street in a width direction to the region from which the film is to be removed is set equal to or shorter than a predetermined upper limit value to cause formation of a step between a region in which the substrate is exposed and a region coated with the film at an outer edge part of the device chip when the wafer is divided into the individual device chips in the dividing step.

2. The manufacturing method of a device chip according to claim 1, wherein
   in the film removal step, the film is removed by positioning a focal point of a laser beam with a wavelength having absorbability with respect to the film onto the film and executing irradiation with the laser beam along the streets to execute ablation processing.

3. The manufacturing method of a device chip according to claim 1, further comprising:
   a wafer support step of sticking a tape to the back surface side of the wafer and supporting an outer circumferential part of the tape by an annular frame before the film removal step, wherein
   in the modified layer forming step, the modified layer is formed inside the wafer through the tape by executing irradiation with a laser beam with a wavelength having transmissibility with respect to the wafer and the tape along the streets from a side of the tape of the wafer for which the wafer support step has been executed in such a manner that the focal point is positioned inside the wafer.

4. The manufacturing method of a device chip according to claim 1 wherein the film is a low dielectric constant insulator coat (Low-k film).

5. The manufacturing method of a device chip according to claim 4 wherein the film is formed of an inorganic film of SiOF, BSG (SiOB), or an organic film that is a polymer film of a polyimide-based material, parylene-based material.

6. The manufacturing method of a device chip according to claim 1 wherein the width of the streets is 80 μm and the predetermined upper limit value is 30 μm.

7. The manufacturing method of a device chip according to claim 1 wherein the distance is set equal to or shorter than the distance between one of the devices and the edge of the film removal region with the minimum width that allows suppression of failure in dividing due to an error in the position at which the modified layer is formed through focusing of the laser beam on a desired position inside the substrate.

8. The manufacturing method of a device chip according to claim 1 wherein the distance is set equal to or longer than a predetermined lower limit value, wherein the predetermined lower limit value is a value smaller than the predetermined upper limit value and is at least larger than the sum of the width of a heat-affected region caused by the laser beam and an error in the formation position of the modified layer formed in the modified layer forming step in the width direction of the street, wherein the heat-affected region is a region in which the film is affected by heat of the laser beam and alters at the edge of a groove formed when ablation processing is executed through irradiation of the film with the laser beam.

9. The manufacturing method of a device chip according to claim 8 wherein by setting the distance in consideration of the width of the heat-affected region and the error in the formation position of the modified layer, the occurrence of a situation in which the device suffers from the heat influence of the laser beam that removes the film and the heat influence of the laser beam that forms the modified layer can be suppressed.

10. The manufacturing method of a device chip according to claim 9 wherein the distance is set equal to or longer than 10 μm.

11. The manufacturing method of a device chip according to claim 1 wherein the distance is set equal to or longer than 10 μm.

12. The manufacturing method of a device chip according to claim 1 wherein in the film removal step, a laser beam is employed, the laser beam comprising a narrow beam that forms a circular spot and a wide beam that forms a spot with an elliptical shape or rectangular shape are used.

13. The manufacturing method of a device chip according to claim 12 wherein in the film removal step, in the region irradiated with the laser beam, both end parts of the street in the width direction are irradiated with the narrow beam with one pass and the region between the circular spots irradiated with the narrow beam is irradiated with the wide beam with two passes.

14. The manufacturing method of a device chip according to claim 1 wherein in the film removal step, a laser beam is employed, and wherein a thickness of the wafer 10 is 200 μm, and wherein laser processing conditions in the film removal step are set as follows:
Wavelength: 355 nm
Output power: 2 W
Frequency: 200 kHz
Feed rate: 500 mm/s
Wide beam width: 25 μm.

15. The manufacturing method of a device chip according to claim 1 wherein in the modified layer forming step, laser processing conditions are set as follows:
Wavelength: 1064 nm
Output power: 0.5 W
Frequency: 100 kHz
Feed rate: 200 mm/s.

16. The manufacturing method of a device chip according to claim 1 wherein in the dividing step the wafer is diced into the individual device chips with use of the modified layer as the origin of breaking by expanding an expanding sheet stuck to a side of a back surface of the wafer in the surface direction and the radial direction.

17. The manufacturing method of a device chip according to claim 1 wherein in the film removal step, the film is removed by dicing processing by a blade.

18. The manufacturing method of a device chip according to claim 1 wherein the modified layer is a region having mechanical strength that is weaker than surrounding unmodified regions of the wafer.

* * * * *